(12) United States Patent
Pakula et al.

(10) Patent No.: US 9,235,240 B2
(45) Date of Patent: Jan. 12, 2016

(54) INSERT MOLDING AROUND GLASS MEMBERS FOR PORTABLE ELECTRONIC DEVICES

(75) Inventors: David Pakula, San Francisco, CA (US); Stephen Brian Lynch, Portola Valley, CA (US); Richard Hung Minh Dinh, Cupertino, CA (US); Tang Yew Tan, San Francisco, CA (US); Lee Hua Tan, Singapore (SG)

(73) Assignee: Apple Inc., Cupertino, CA (US)

( * ) Notice: Subject to any disclaimer, the term of this patent is extended or adjusted under 35 U.S.C. 154(b) by 605 days.

(21) Appl. No.: 12/944,671

(22) Filed: Nov. 11, 2010

(65) Prior Publication Data

US 2012/0118628 A1    May 17, 2012

(51) Int. Cl.
*H01L 23/28*    (2006.01)
*G06F 1/16*    (2006.01)
*H04M 1/02*    (2006.01)

(52) U.S. Cl.
CPC ............ *G06F 1/1656* (2013.01); *G06F 1/1626* (2013.01); *H04M 1/0266* (2013.01)

(58) Field of Classification Search
CPC .................................................... H04M 1/0266
USPC .............................. 174/520; 455/575.1, 575.8
See application file for complete search history.

(56) References Cited

U.S. PATENT DOCUMENTS

| D118,749 S | 1/1940 | Zimmerman |
| D124,596 S | 1/1941 | Arenberg |
| 2,269,554 A | 1/1942 | Rolph |
| 4,403,224 A | 9/1983 | Wirnowski |
| 4,522,508 A | 6/1985 | Meister |
| 4,995,941 A | 2/1991 | Nelson et al. |
| 5,394,306 A | 2/1995 | Koenck et al. |
| 5,456,955 A | 10/1995 | Muggli |
| 5,514,319 A | 5/1996 | Young |
| 5,613,237 A | 3/1997 | Bent et al. |
| 5,681,515 A | 10/1997 | Pratt et al. |
| 5,867,149 A | 2/1999 | Jaeger |
| 5,932,329 A | 8/1999 | Frost et al. |
| 6,058,293 A | 5/2000 | Phillips |
| 6,206,563 B1 | 3/2001 | Dombre et al. |
| 6,229,993 B1 | 5/2001 | Greenway et al. |
| 6,266,685 B1 | 7/2001 | Danielson et al. |

(Continued)

FOREIGN PATENT DOCUMENTS

| EP | 0458016 A1 | 11/1991 |
| JP | 6-94848 | 4/2004 |

(Continued)

OTHER PUBLICATIONS

U.S. Appl. No. 12/794,563, filed Jun. 4, 2010.
U.S. Appl. No. 12/794,617, filed Jun. 4, 2010.

(Continued)

*Primary Examiner* — Hung V Ngo (57) ABSTRACT

An electronic device having an enclosure formed from at least one glass cover and a peripheral structure formed adjacent the periphery of the glass cover is disclosed. The peripheral structure can be secured adjacent to the glass cover with an adhesive. The peripheral structure can be molded adjacent the glass cover so that a gapless interface is formed between the peripheral structure and the periphery of the glass cover. In one embodiment, the peripheral structure includes at least an inner peripheral structure and an outer peripheral structure.

37 Claims, 7 Drawing Sheets

(56) References Cited

U.S. PATENT DOCUMENTS

| | | | |
|---|---|---|---|
| 6,323,846 | B1 | 11/2001 | Westerman et al. |
| 6,462,890 | B2 | 10/2002 | Hsu |
| 6,510,226 | B1 | 1/2003 | Thomann et al. |
| 6,532,152 | B1 | 3/2003 | White et al. |
| 6,650,092 | B1 | 11/2003 | Lidak et al. |
| 6,777,621 | B2 | 8/2004 | Ishikawa et al. |
| 6,796,708 | B2 | 9/2004 | Kawamata et al. |
| 6,825,751 | B1 | 11/2004 | Kita et al. |
| 6,842,288 | B1 | 1/2005 | Liu et al. |
| 6,876,543 | B2 | 4/2005 | Mockridge et al. |
| 6,965,789 | B2 | 11/2005 | Hauge et al. |
| 6,980,095 | B2 | 12/2005 | Wright et al. |
| 7,031,148 | B1 | 4/2006 | Lin |
| 7,046,230 | B2 | 5/2006 | Zadesky et al. |
| 7,073,916 | B2 | 7/2006 | Yin et al. |
| 7,113,237 | B2 | 9/2006 | Nitto et al. |
| 7,236,588 | B2 | 6/2007 | Gartrell |
| 7,595,983 | B2 | 9/2009 | Okuda |
| D606,539 | S | 12/2009 | Liao et al. |
| 7,636,244 | B2 | 12/2009 | Kriege et al. |
| 7,697,269 | B2 | 4/2010 | Yang et al. |
| 7,697,281 | B2 | 4/2010 | Dabov et al. |
| 7,711,256 | B2 | 5/2010 | Wun |
| 7,872,861 | B2 | 1/2011 | Ou et al. |
| 7,933,123 | B2 | 4/2011 | Wang et al. |
| 8,004,835 | B2 | 8/2011 | Conti et al. |
| 8,023,261 | B2 | 9/2011 | Sanford |
| 8,238,087 | B2 | 8/2012 | McClure et al. |
| 8,254,098 | B2 | 8/2012 | Liu et al. |
| 8,320,978 | B2 * | 11/2012 | Chang et al. ............... 455/575.1 |
| 8,797,721 | B2 | 8/2014 | Pakula et al. |
| 2003/0006128 | A1 | 1/2003 | Giles et al. |
| 2003/0045246 | A1 | 3/2003 | Lee et al. |
| 2003/0108720 | A1 | 6/2003 | Kashino |
| 2003/0164905 | A1 | 9/2003 | Yamaoka et al. |
| 2003/0184894 | A1 | 10/2003 | Bischof et al. |
| 2004/0022017 | A1 | 2/2004 | Chuang |
| 2004/0042168 | A1 | 3/2004 | Yang et al. |
| 2004/0079457 | A1 | 4/2004 | Kimura et al. |
| 2005/0052425 | A1 | 3/2005 | Zadesky et al. |
| 2005/0062902 | A1 | 3/2005 | Fukayama |
| 2005/0083308 | A1 | 4/2005 | Homer et al. |
| 2005/0130721 | A1 | 6/2005 | Gartrell |
| 2005/0285991 | A1 | 12/2005 | Yamazaki |
| 2005/0286214 | A1 | 12/2005 | Chen |
| 2006/0055839 | A1 | 3/2006 | Hirao et al. |
| 2006/0132644 | A1 | 6/2006 | Shangguan et al. |
| 2006/0158839 | A1 | 7/2006 | Deluga |
| 2006/0197750 | A1 | 9/2006 | Kerr et al. |
| 2006/0239746 | A1 | 10/2006 | Grant |
| 2006/0268528 | A1 | 11/2006 | Zadesky et al. |
| 2007/0025072 | A1 | 2/2007 | Liao |
| 2007/0052679 | A1 | 3/2007 | Liang |
| 2007/0173299 | A1 | 7/2007 | Sawayama et al. |
| 2007/0257398 | A1 | 11/2007 | Moncrieff |
| 2008/0062660 | A1 | 3/2008 | Weber et al. |
| 2008/0092809 | A1 | 4/2008 | Lin et al. |
| 2008/0131683 | A1 | 6/2008 | Ristic-Lehmann et al. |
| 2008/0146293 | A1 | 6/2008 | Kim et al. |
| 2008/0166009 | A1 | 7/2008 | Dinh et al. |
| 2008/0206492 | A1 | 8/2008 | Husemann et al. |
| 2008/0239647 | A1 | 10/2008 | Luo et al. |
| 2008/0264548 | A1 | 10/2008 | Zhang |
| 2008/0266766 | A1 | 10/2008 | D'Urso et al. |
| 2008/0316117 | A1 | 12/2008 | Hill et al. |
| 2009/0002930 | A1 | 1/2009 | Nakanishi et al. |
| 2009/0046072 | A1 | 2/2009 | Emig et al. |
| 2009/0046240 | A1 | 2/2009 | Bolton |
| 2009/0054115 | A1 * | 2/2009 | Horrdin et al. ............. 455/575.8 |
| 2009/0059485 | A1 | 3/2009 | Lynch et al. |
| 2009/0059502 | A1 | 3/2009 | Filson et al. |
| 2009/0065136 | A1 | 3/2009 | Nadella et al. |
| 2009/0067141 | A1 | 3/2009 | Dabov et al. |
| 2009/0093575 | A1 | 4/2009 | Kabashima et al. |
| 2009/0245564 | A1 | 10/2009 | Mittleman et al. |
| 2009/0257189 | A1 | 10/2009 | Wang et al. |
| 2009/0257207 | A1 | 10/2009 | Wang et al. |
| 2009/0264160 | A1 | 10/2009 | Mochizuki et al. |
| 2009/0296325 | A1 | 12/2009 | Morimoto et al. |
| 2010/0014232 | A1 | 1/2010 | Nishimura |
| 2010/0060563 | A1 | 3/2010 | Hayton et al. |
| 2010/0061040 | A1 | 3/2010 | Dabov et al. |
| 2010/0061044 | A1 | 3/2010 | Zou et al. |
| 2010/0089729 | A1 | 4/2010 | Li et al. |
| 2010/0091442 | A1 | 4/2010 | Theoblad et al. |
| 2010/0120480 | A1 | 5/2010 | Jung |
| 2010/0149410 | A1 | 6/2010 | Matsuzawa |
| 2010/0190530 | A1 | 7/2010 | Wade et al. |
| 2010/0203924 | A1 | 8/2010 | Hirota |
| 2010/0269891 | A1 | 10/2010 | Kinard et al. |
| 2010/0283394 | A1 | 11/2010 | Ong |
| 2010/0315570 | A1 * | 12/2010 | Mathew et al. ................ 349/58 |
| 2011/0050053 | A1 | 3/2011 | Deng |
| 2011/0050054 | A1 | 3/2011 | Chang et al. |
| 2011/0086676 | A1 | 4/2011 | Choi et al. |
| 2011/0096483 | A1 | 4/2011 | Sapper et al. |
| 2011/0136553 | A1 * | 6/2011 | Jo ............................. 455/575.3 |
| 2011/0164365 | A1 | 7/2011 | McClure et al. |
| 2011/0165361 | A1 | 7/2011 | Sherman et al. |
| 2011/0186345 | A1 | 8/2011 | Pakula et al. |
| 2011/0187245 | A1 | 8/2011 | Pakula et al. |
| 2011/0188180 | A1 | 8/2011 | Pakula et al. |
| 2011/0215685 | A1 | 9/2011 | Jarvis et al. |
| 2011/0255227 | A1 | 10/2011 | Murakami |
| 2011/0255518 | A9 | 10/2011 | Pakula et al. |
| 2012/0113611 | A1 | 5/2012 | Maniar et al. |
| 2012/0275088 | A1 | 11/2012 | Huang |

FOREIGN PATENT DOCUMENTS

| | | |
|---|---|---|
| JP | A 2006-276623 | 10/2006 |
| JP | A 2008-518807 | 6/2008 |
| JP | A 2009/259908 | 11/2009 |
| JP | A 2010-091742 | 4/2010 |
| WO | WO 2008/035736 | 3/2008 |
| WO | 2009/024842 A1 | 2/2009 |
| WO | 2009/126480 A2 | 10/2009 |
| WO | 2010/033571 | 3/2010 |
| WO | WO 2010/074144 | 7/2010 |
| WO | 2010/101961 A2 | 9/2010 |

OTHER PUBLICATIONS

U.S. Appl. No. 12/794,646, filed Jun. 4, 2010.
U.S. Appl. No. 12/895,822, filed Sep. 30, 2010.
International Search Report for International Application No. PCT/US2011/058999, mailed Feb. 15, 2012.
Written Opinion for International Application No. PCT/US2011/058999, mailed Feb. 15, 2012.
International Preliminary Report for International Patent Application No. PCT/US2011/058999, mailed May 23, 2013.
Lu, "Liquid Optically Clear Adhesives for display Applications", Henkeina.com, Apr. 1, 2001, pp. 1-4.
Henkel, "Loctite Liquid Optically Clear Adhesives", Henkeina.com, downloaded Mar. 18, 2013, pp. 1-2.
Office Action for Taiwanese Patent Application No. 100141093, mailed Aug. 30, 2013.
Office Action for Taiwanese Patent Application No. 100141093, mailed Mar. 25, 2014.
Notice of Preliminary Rejection for Korean Patent Application No. 10-2013-7014922, mailed Jun. 27, 2014.
Office Action for Japanese Patent Application No. 2013-538787, mailed Jun. 20, 2014.
Office Action for U.S. Appl. No. 13/541,617, mailed May 29, 2014.
Office Action for Australian Patent Application No. 2011326249, mailed Nov. 5, 2014.
Notice of Final Rejection for Korean Patent Application No. 10-2013-7014922, mailed Jan. 7, 2015.
Final Office Action for Taiwanese Patent Application No. 100141093, mailed Jan. 8, 2015.
Japanese Office Action for Japanese Patent Application No. 2013-538787, mailed Apr. 17, 2015.

* cited by examiner

INSERT MOLDING AROUND GLASS MEMBERS FOR PORTABLE ELECTRONIC DEVICES

BACKGROUND

Conventionally, a portable electronic device has a housing that encases the various electrical components of the portable electronic device. Often, the portable electronic device has a display arrangement that includes various layers. The various layers usually include at least a display technology layer, and may additionally include a sensing arrangement (e.g., touch sensors or touch screen) and/or a cover window disposed over the display technology layer. The cover window can be a plastic or glass cover that provides a protective outer surface that protects the display technology layer. The cover window can form part of an outer surface for the housing of the portable electronic device. Conventionally, supporting or securing the cover window to other portions of the housing tends to impede usage of a peripheral area of the cover window.

Unfortunately, however, as portable electronic device continue to be made smaller, thinner and/or more powerful, there remains a continuing need to provide improved techniques and structures for supporting cover windows of portable electronic device housings.

SUMMARY

The invention pertains to an electronic device having an enclosure formed from at least one glass cover and a peripheral structure formed adjacent the periphery of the glass cover. The peripheral structure can be secured adjacent to the glass cover with an adhesive. The peripheral structure can be molded adjacent the glass cover so that a gapless interface is formed between the peripheral structure and the periphery of the glass cover. In one embodiment, the peripheral structure can include at least an inner peripheral structure and an outer peripheral structure. The enclosure for the electronic device is can be thin yet be sufficiently strong to be suitable for use in electronic devices, such as portable electronic devices.

The invention can be implemented in numerous ways, including as a method, system, device, or apparatus. Several embodiments of the invention are discussed below.

As an electronic device enclosure, one embodiment can, for example, include at least a glass cover for a top surface for the electronic device enclosure, an adhesive deposited around a periphery of the glass cover, and a peripheral structure for providing a support surface for the glass cover and for providing side protective surfaces for the glass cover. The peripheral structure is at least partially secured to the glass cover by the adhesive.

As a method for assembling an electronic device, one embodiment of the method can, for example, include at least: obtaining a glass member having a top surface and a bottom surface, the top surface providing an outer surface for substantially all of a surface of the electronic device; depositing an adhesive layer around a periphery of the bottom surface of the glass member; aligning the glass member relative to a support structure for the electronic device; and molding a peripheral protective side portion for the electronic device, the peripheral protective side portion being molded adjacent the periphery of the glass member, adjacent the adhesive layer, and adjacent the support structure.

As a method for assembling an electronic device, one embodiment of the method can, for example, include at least: obtaining a glass member having a top surface and a bottom surface, the top surface providing an outer surface for substantially all of a surface of the electronic device; attaching an internal periphery member to a periphery of the bottom surface of the glass member; and molding an outer periphery member adjacent a periphery of the glass member and adjacent the internal periphery member.

As a method for assembling an electronic device, one embodiment of the method can, for example, include at least: obtaining a glass member having a top surface and a bottom surface, the top surface providing an outer surface for substantially all of a surface of the electronic device; providing an adhesive layer around a periphery of the bottom surface of the glass member; and molding a peripheral protective side portion for the electronic device. The peripheral protective side portion being molded adjacent the periphery of the glass member and being secured to the glass member via the adhesive layer.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF EMBODIMENTS OF THE INVENTION

Embodiments are described herein in the context of a housing for an electronic device. The housing can make use of an outer member, which can be formed of glass. The outer member can be aligned, protected and/or secured with respect to other portions of the housing for the electronic device. The electronic device can be portable and in some cases handheld.

According to one aspect, the invention pertains to an electronic device having an enclosure formed from at least one glass cover and a peripheral structure formed adjacent the periphery of the glass cover. The peripheral structure can be secured adjacent to the glass cover with an adhesive. The peripheral structure can be molded adjacent the glass cover so that a gapless interface is formed between the peripheral structure and the periphery of the glass cover. In one embodiment, the peripheral structure includes at least an inner peripheral structure and an outer peripheral structure.

The following detailed description is illustrative only, and is not intended to be in any way limiting. Other embodiments will readily suggest themselves to skilled persons having the benefit of this disclosure. Reference will now be made in detail to implementations as illustrated in the accompanying drawings. The same reference indicators will generally be used throughout the drawings and the following detailed description to refer to the same or like parts. It should be appreciated that the drawings are generally not drawn to scale, and at least some features of the drawings have been exaggerated for ease of illustration.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Embodiments of the invention can relate to apparatus, systems and methods for forming a housing having a thin glass member for an electronic device. In one example, the glass member may be an outer surface of an electronic device. The glass member may for example correspond to a glass cover that helps form part of a display area of an electronic device (i.e., situated in front of a display either as a separate part or integrated within the display. Alternatively or additionally, the glass member may form a part of the housing. For example, it may form an outer surface other than in the display area.

The apparatus, systems and methods for improving strength of thin glass are especially suitable for glass covers, or displays (e.g., LCD displays), assembled in small form factor electronic devices such as handheld electronic devices (e.g., mobile phones, media players, personal digital assistants, remote controls, etc.). The glass can be thin in these small form factor embodiments, such as less than 3 mm, or more particularly between 0.5 and 2.5 mm, or even more particularly between 0.3 and 1.0 mm. The apparatus, systems and methods can also be used for glass covers or displays for other devices including, but not limited to including, relatively larger form factor electronic devices (e.g., portable computers, tablet computers, displays, monitors, televisions, etc.). The glass can also be thin in these larger form factor embodiments, such as less than 5 mm, or more particularly between 0.5 and 3 mm, or even more particularly between 0.3 and 2.0 mm.

Embodiments are discussed below with reference to FIGS. 1-7C. However, those skilled in the art will readily appreciate that the detailed description given herein with respect to these figures is for explanatory purposes as the invention extends beyond these limited embodiments.

Figure 1:
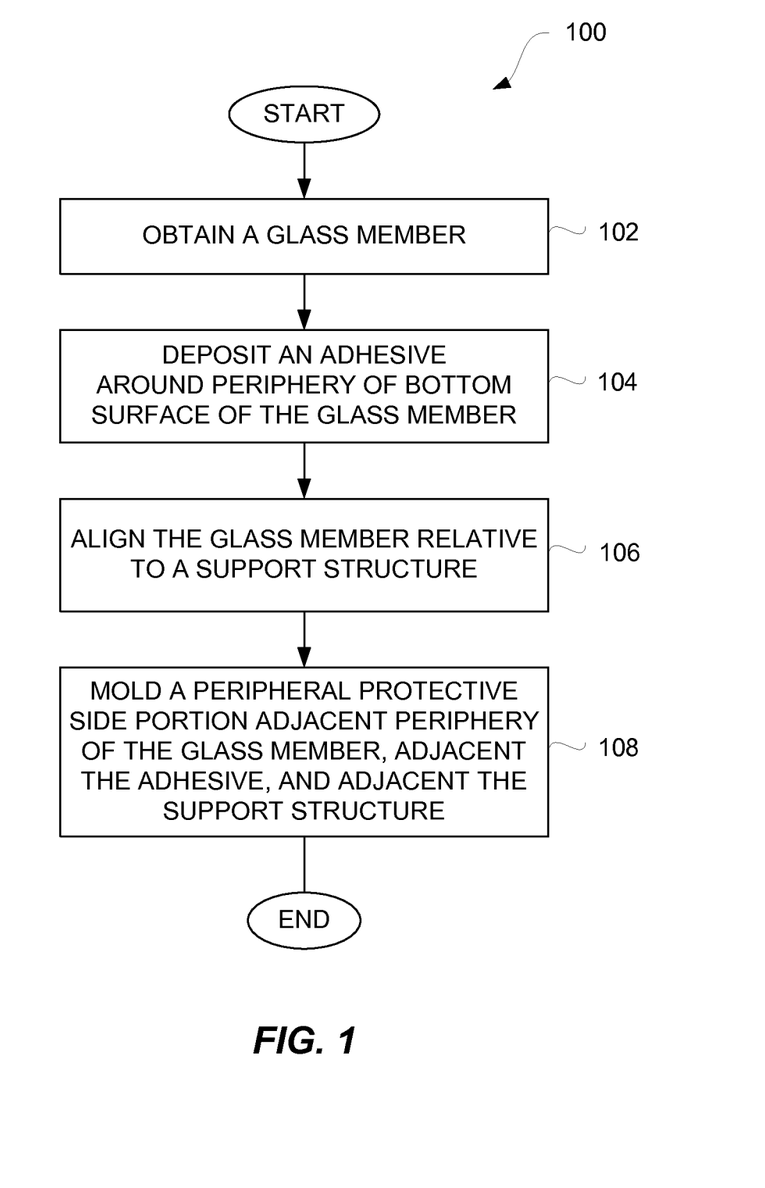
FIG. 1 is a flow diagram of a housing formation process according to one embodiment of the invention.

FIG. 1 a flow diagram of a housing formation process 100 according to one embodiment of the invention. The housing formation process 100 can operate to produce a housing for an electronic device, or at least a portion of such a housing.

The housing formation process 100 can initially obtain 102 a glass member. The glass member is to serve as a significant outer surface for the housing. For example, the glass member can correspond to a top surface for the housing. Alternatively or additionally, the glass member can correspond to a bottom surface for the housing. The glass member is typically thin, particularly when used with portable electronic devices. In one embodiment, the glass member has a thickness of less than 5 mm, or more particularly less than 1 mm.

After the glass member has been obtained 102, an adhesive can be deposited 104 around a periphery of a bottom surface of the glass member. The glass member has a top surface that can represent an outer surface for the housing, and a bottom surface that is an inner surface that is not exposed. In one embodiment, the adhesive being deposited 104 can be a thermally activated adhesive. The adhesive can, for example, by provided as film or as a layer. Also, the manner by which the adhesive is deposited can vary. In one implementation, the adhesive can be deposited 104 by forming a ring-like pattern of adhesive that can be placed around the periphery of the bottom surface of the glass member. In another implementation, the adhesive can be screen printed onto the periphery of the bottom surface of the glass member.

Thereafter, the glass member can be aligned 106 relative to a support structure. The support structure can be provided as being a component of the housing for the electronic device. For example, the support can pertain to a side structure for the housing or an interior support member. After the glass member has been aligned 106 with the support structure, a peripheral protective side portion can be molded 108 adjacent to the periphery of the glass member and adjacent to the adhesive. The adhesive can serve to secure the peripheral protective side member to the glass member. The peripheral protective side member being molded 108 can also be formed adjacent the support structure. Typically, the peripheral side portion would also be secured to the support structure by chemical bonding and/or mechanical features (e.g., undercuts or interlocks). In such case, the glass member and the peripheral protective side member are secured to the support structure and thus form at least a portion of the housing for the electronic device. Also, if the adhesive is thermally activated, the molding 108 can also serve to activate the thermally activated adhesive so that a strong bond can be provided to the glass member and the peripheral protective side member.

Figure 2A:
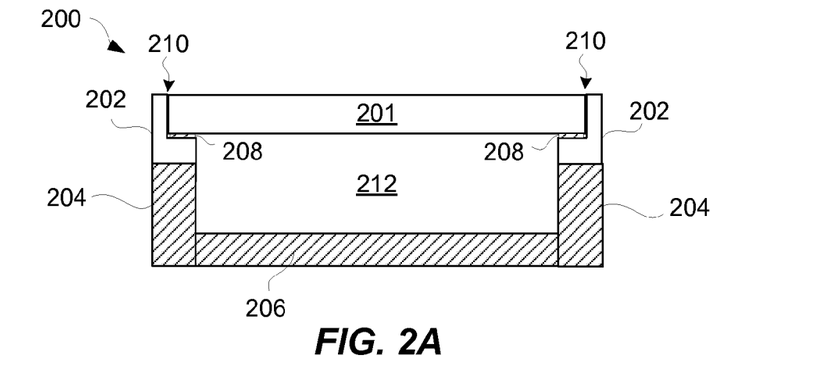
FIG. 2A is a cross-sectional view of an electronic device housing according to one embodiment.

FIG. 2A is a cross-sectional view of an electronic device housing 200 according to one embodiment. The electronic device housing 200 includes an outer housing member 201 supported and protected by a protective side member 202. The protective side member 202 being positioned tightly adjacent sides of the outer housing member 201. The protective side members 202 can provide a thin layer of material positioned tightly adjacent sides of the outer housing member 201, thereby buffering impact at the sides of the outer housing member 201. The protective side member 202 also supports the outer housing member 201 and serves to secure the outer housing member 201 to other portions of the electronic device housing 200. In one embodiment, the protective side member 202 extends around all sides of the outer housing member 201. In another embodiment, the protective side member 202 extends around those of the sides of the outer housing member 201 that would otherwise be exposed.

As shown in FIG. 2A, the outer housing member 201 can be secured to a support structure 204 of the electronic device housing 200. The support structure 204 can, for example, be an outer periphery member for the electronic device housing 200. In one embodiment, the support structure 204 can couple to another outer housing member 206, which can be formed differently than the outer housing member 201.

The protective side member 202 can be secured tightly adjacent the sides of the outer housing member 201 using an adhesive 208. In one embodiment, the adhesive 208 can be applied as a layer of adhesive that is provided around a periphery of an inner side of the outer housing member 201. The protective side member 202 can also be molded in place so as to be tightly adjacent the sides of the outer housing member 201. By molding the protective side member 202 in place, the outer exposed interface 210 between the sides (e.g., edges) of the outer housing member 201 and the peripheral side member 202 is essentially gap-free. The protective side member 202 can also be molded against the adhesive 208 deposited on the periphery of the bottom side of the outer housing member 201. The adhesive 208 can thus serve to secure the protective side member 202 against the sides of the outer housing member 201. Also, if the adhesive 208 is thermally activated, the molding of the protective side member 202 can also serve to activate the thermally activated adhesive 208 so that a strong bond can be provided to the outer housing member 201 and the peripheral protective side member 202 via the adhesive 208. An internal space 212 is provided internal to the electronic device housing 200 whereby various electrical components can be attached, affixed or placed so as to provide electronic operations for the electronic device.

The various members, parts or assemblies of the electronic device housing 200 can be formed of any of a variety of materials, e.g., glass, polymers or metal. In one embodiment, the outer housing member 201 is glass, the protective side member 202 is be formed from polymer (e.g., thermoplastic), the support structure 204 is formed from metal or polymer (e.g., plastic), and the another outer housing member 206 is formed from glass, polymer (e.g., plastic) or metal. More particularly, in some embodiments, the protective side member 202 can be a structurally strengthened polymer (e.g., thermoplastic). As an example, the protective side member 202 can be polymer, such as polyarylamide, nylon or polycarbonate, which can be structurally strengthened by including glass fibers. For example, some examples of some structurally strengthened polymers include 50% glass filled nylon and 30% glass filled polycarbonate.

Figure 2B:
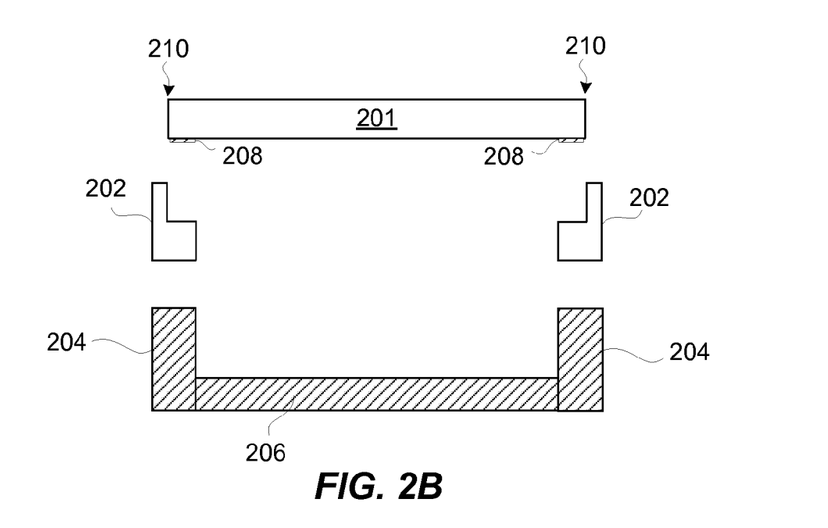
FIG. 2B is a cross-sectional assembly diagram for the electronic device housing shown in FIG. 2A, according to one embodiment.

FIG. 2B is a cross-sectional assembly diagram for the electronic device housing 200 shown in FIG. 2A, according to one embodiment. The outer housing member 201 has a top surface 214 and a bottom surface 216. The bottom surface 216 of the outer housing member 201 has adhesive 208 applied as a layer of adhesive that is provided around a periphery of the bottom surface 216 of the outer housing member 201. The protective side member 202 can then be molded adjacent the sides of the outer housing member 201. When the protective side member 202 is molded, the protective side member 202 is also at least partially formed adjacent the adhesive 208 on the bottom surface 216 of the outer housing member. Moreover, when the protective side member 202 is formed, the protective side member 202 can also be adjacent and secured to an upper side portion 218 of the support structure 204. When the protective side member 202 are provided at the sides (i.e., edges) of the outer housing member 201, the protective side member 202 provides a buffer layer (e.g., bumper) that dampens impact induced at the sides of the outer housing member 201 of the electronic device housing 200.

Figure 2C:
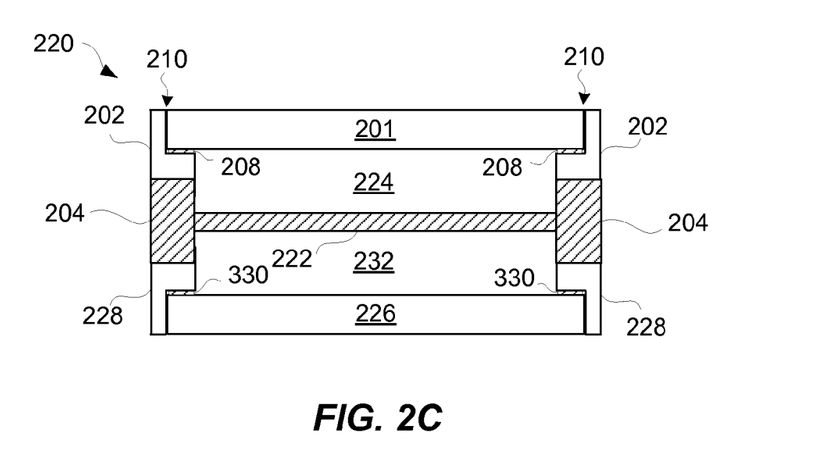
FIG. 2C is a cross-sectional view of an electronic device housing according to one embodiment.

FIG. 2C is a cross-sectional view of an electronic device housing 220 according to one embodiment. The electronic device housing 220 includes a first outer housing member 201 supported and protected by a first protective side member 202. The first protective side member 202 is positioned tightly adjacent sides of the first outer housing member 201. The first protective side member 202 also supports the first outer housing member 201 and serves to secure the first outer housing member 201 to other portions of the electronic device housing 220. In this embodiment, the first protective side member 202 is secured to not only the first outer housing member 201 but also a support structure 204. The support structure 204 may be an outer periphery member for the electronic device housing 220.

The first protective side member 202 can be secured tightly adjacent the sides of the outer housing member 201 using the adhesive 208. In one embodiment, the adhesive 208 can be applied as a layer of adhesive that is provided around a periphery of an inner side of the first outer housing member 201. The first protective side member 202 can also be molded in place so as to be tightly adjacent the sides of the first outer housing member 201. By molding the first protective side member 202 in place, the outer exposed interface 210 between the sides (e.g., edges) of the outer housing member 201 and the peripheral side member 202 is essentially gap-free. The first protective side member 202 can also be molded against the adhesive 208 deposited on the periphery of the bottom side of the first outer housing member 201. The adhesive 208 can thus serve to secure the first protective side member 202 against the sides of the outer housing member 201. Also, if the adhesive 208 is thermally activated, the molding of the first protective side member 202 can also serve to activate the thermally activated adhesive 208 so that a strong bond can be provided to the first outer housing member 201 and the first peripheral protective side member 202 via the adhesive 208.

The electronic device housing 220 can also include an internal structure 222 that is integral with or secured to the support structure 204. In one embodiment, the internal structure 222 can be secured to an inner surface of the support structure 204 such that it is offset from front and back planar boundaries of the support structure 204 (which may be an outer periphery member). As shown in FIG. 2C, the internal structure 222 can be secured at the mid-point of the height of the support structure 204. A first internal space 224 is provided internal to the electronic device housing 220 whereby various electrical components can be attached, affixed or placed so as to provide electronic operations for the electronic device.

In this embodiment, the electronic device housing 220 can also include similar structures on an opposite side of the electronic device housing 220. Namely, the electronic device housing 220 can further include a second outer housing member 226 supported and protected by a second protective side member 228. The second protective side member 228 can be positioned tightly adjacent sides of the second outer housing member 226. The second protective side member 228 also supports the second outer housing member 226 and serves to secure the second outer housing member 226 to other portions of the electronic device housing 220. In this embodiment, the second protective side member 228 is secured to not only the second outer housing member 226 but also the support structure 204. As previously noted, the support structure 204 may be an outer periphery member for the electronic device housing 220. In this embodiment, the second protective side member 228 can be secured to the outer periphery member 204 on the opposite side from the first protective side member 202. The second protective side member 228 can be secured tightly adjacent the sides of the second outer housing member 226 using an adhesive 330. In one embodiment, the adhesive 330 can be applied as a layer of adhesive that is provided around a periphery of an inner side of the second outer housing member 226. The second protective side member 228 can also be molded in place so as to be tightly adjacent the sides of the second outer housing member 226. Further, a second internal space 232 is provided internal to the electronic device housing 220 (between the internal structure 222 and the second outer housing member 226) whereby various electrical components can be attached, affixed or placed so as to provide electronic operations for the electronic device. The second internal space 230 can be separate from or joined with the first internal space 224.

In one embodiment, the first outer housing member 201 can represent a top outer surface for the portable electronic device, and the second outer surface housing 226 can represent a bottom outer surface housing. In one embodiment, both the first outer housing member 201 and the second outer housing member 226 are glass (e.g., glass covers).

Figures 3A, 3B:
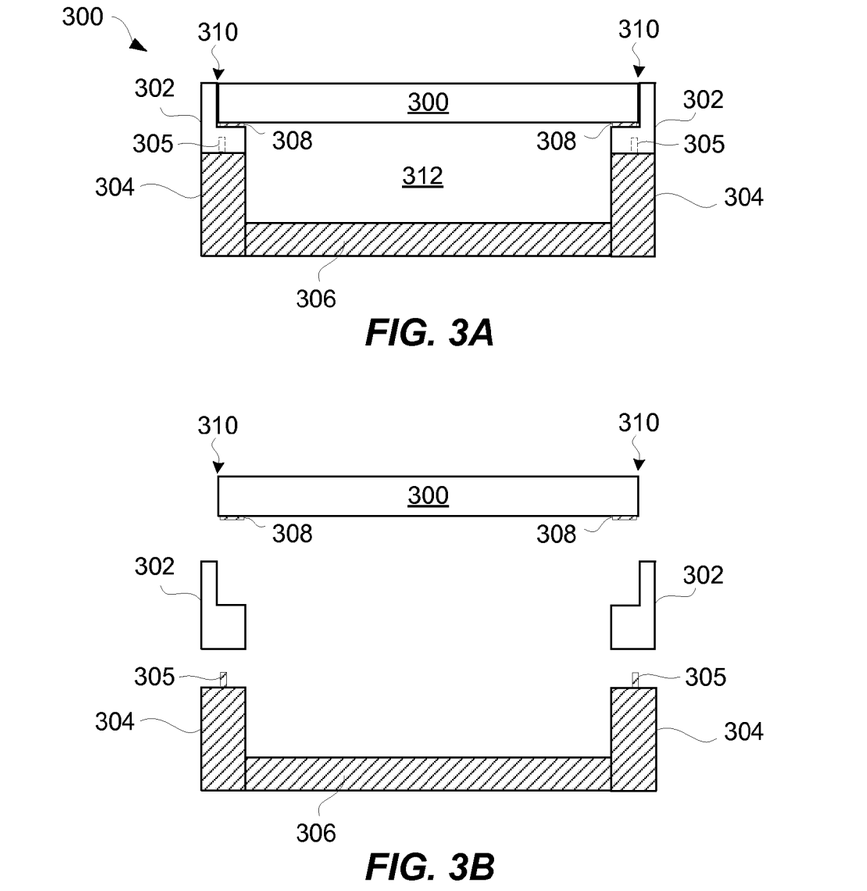
FIG. 3A is a cross-sectional view of an electronic device housing according to one embodiment.
FIG. 3B is a cross-sectional assembly diagram for the electronic device housing shown in FIG. 3A, according to one embodiment.

FIG. 3A is a cross-sectional view of an electronic device housing 300 according to one embodiment. The electronic device housing 300 includes an outer housing member 301 supported and protected by a protective side member 302. The protective side member 302 being positioned tightly adjacent sides of the outer housing member 301. The protective side members 302 can provide a thin layer of material positioned tightly adjacent sides of the outer housing member 301, thereby buffering impact at the sides of the outer housing member 301. The protective side member 302 also supports the outer housing member 301 and serves to secure the outer housing member 301 to other portions of the electronic device housing 300. In one embodiment, the protective side member 302 extends around all sides of the outer housing member 301. In another embodiment, the protective side member 302 extends around those of the sides of the outer housing member 301 that would otherwise be exposed.

As shown in FIG. 3A, the outer housing member 301 can be secured to a support structure 304 of the electronic device housing 300. In one embodiment, as shown in FIG. 3A, one or more securing features 305 can be provided on an upper surface of the housing structure 304. The securing features 305 can be integral with the housing structure 304. The securing features 305 (e.g., mechanical features, such as undercuts or interlocks) can be used to assist with the securing of the protective side member 302 (and thus the outer housing member 301) to the housing structure 304. The support structure 304 can, for example, be an outer periphery member for the electronic device housing 300. The support structure 304 can couple to another outer housing member 306, which can be formed differently than the outer housing member 301.

The protective side member 302 can be secured tightly adjacent the sides of the outer housing member 301 using an adhesive 308. In one embodiment, the adhesive 308 can be applied as a layer of adhesive that is provided around a periphery of an inner side of the outer housing member 301. The protective side member 302 can also be molded in place so as to be tightly adjacent the sides of the outer housing member 301. By molding the protective side member 302 in place, the outer exposed interface 310 between the sides (e.g., edges) of the outer housing member 301 and the peripheral side member 302 is essentially gap-free. The protective side member 302 can also be molded against the adhesive 308 deposited on the periphery of the bottom side of the outer housing member 301. The adhesive 308 can thus serve to secure the protective side member 302 against the sides of the outer housing member 301. Also, if the adhesive 308 is thermally activated, the molding of the protective side member 302 can also serve to activate the thermally activated adhesive 308 so that a strong bond can be provided to the outer housing member 301 and the peripheral protective side member 302 via the adhesive 308. An internal space 312 is provided internal to the electronic device housing 300 whereby various electrical components can be attached, affixed or placed so as to provide electronic operations for the electronic device.

The various members, parts or assemblies of the electronic device housing 300 can be formed of any of a variety of materials, e.g., glass, polymers or metal. In one embodiment, the outer housing member 301 is glass, the protective side member 302 is be formed from polymer (e.g., thermoplastic), the support structure 304 is formed from metal or polymer (e.g., plastic), and the another outer housing member 306 is formed from glass, polymer (e.g., plastic) or metal. More particularly, in some embodiments, the protective side member 302 can be a structurally strengthened polymer (e.g., thermoplastic). As an example, the protective side member 302 can be polymer, such as polyarylamide, nylon or polycarbonate, which can be structurally strengthened by including glass fibers. For example, some examples of some structurally strengthened polymers include 50% glass filled nylon and 30% glass filled polycarbonate.

FIG. 3B is a cross-sectional assembly diagram for the electronic device housing 300 shown in FIG. 3A, according to one embodiment. The outer housing member 301 has a top surface 314 and a bottom surface 316. The bottom surface 316 of the outer housing member 301 has adhesive 308 applied as a layer of adhesive that is provided around a periphery of the bottom surface 316 of the outer housing member 301. The protective side member 302 can then be molded adjacent the sides of the outer housing member 301. When the protective side member 302 is molded, the protective side member 302 is also at least partially formed adjacent the adhesive 308 on the bottom surface 316 of the outer housing member. Moreover, when the protective side member 302 is formed, the protective side member 302 can also be adjacent and secured to an upper side portion 318 of the support structure 304. In one embodiment, as shown in FIG. 3B, one or more securing features 305 can be provided on an upper surface of the housing structure 304. The protective side member 302 can be also molded around the one or more securing features 305, which can further secure the protective side member 302 to the support structure 304. When the protective side member 302 are provided at the sides (i.e., edges) of the outer housing member 301, the protective side member 302 provides a buffer layer (e.g., bumper) that dampens impact induced at the sides of the outer housing member 301 of the electronic device housing 300.

Figure 3C:
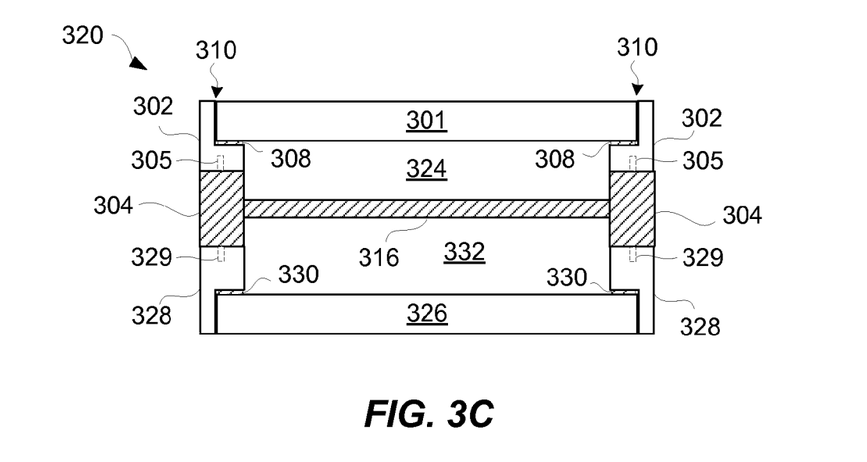
FIG. 3C is a cross-sectional view of an electronic device housing according to one embodiment.

FIG. 3C is a cross-sectional view of an electronic device housing 320 according to one embodiment. The electronic device housing 320 includes a first outer housing member 301 supported and protected by a first protective side member 302. The first protective side member 302 is positioned tightly adjacent sides of the first outer housing member 301. The first protective side member 302 also supports the first outer housing member 301 and serves to secure the first outer housing member 301 to other portions of the electronic device housing 320. In this embodiment, the first protective side member 302 is secured to not only the first outer housing member 301 but also a support structure 304. In addition, in this embodiment, one or more securing features 305 can be provided on an upper surface of the housing structure 304. The support structure 304 may be an outer periphery member for the electronic device housing 320.

The first protective side member 302 can be secured tightly adjacent the sides of the outer housing member 301 using the adhesive 308. In one embodiment, the adhesive 308 can be applied as a layer of adhesive that is provided around a periphery of an inner side of the first outer housing member 301. The first protective side member 302 can also be molded in place so as to be tightly adjacent the sides of the first outer housing member 301. By molding the first protective side member 302 in place, the outer exposed interface 310 between the sides (e.g., edges) of the outer housing member 301 and the peripheral side member 302 is essentially gap-free. The first protective side member 302 can also be molded against the adhesive 308 deposited on the periphery of the bottom side of the first outer housing member 301. The adhesive 308 can thus serve to secure the first protective side member 302 against the sides of the outer housing member 301. Also, if the adhesive 308 is thermally activated, the molding of the first protective side member 302 can also serve to activate the thermally activated adhesive 308 so that a strong bond can be provided to the first outer housing member 301 and the first peripheral protective side member 302 via the adhesive 308.

The electronic device housing 320 can also include an internal structure 322 that is integral with or secured to the support structure 304. In one embodiment, the internal structure 322 can be secured to an inner surface of the support structure 304 such that it is offset from front and back planar boundaries of the support structure 304 (which may be an outer periphery member). As shown in FIG. 3C, the internal structure 322 can be secured at the mid-point of the height of the support structure 304. A first internal space 324 is provided internal to the electronic device housing 320 whereby various electrical components can be attached, affixed or placed so as to provide electronic operations for the electronic device.

In this embodiment, the electronic device housing 320 can also include similar structures on an opposite side of the electronic device housing 320. Namely, the electronic device housing 320 can further include a second outer housing member 326 supported and protected by a second protective side member 328. The second protective side member 328 can be positioned tightly adjacent sides of the second outer housing member 326. The second protective side member 328 also supports the second outer housing member 326 and serves to secure the second outer housing member 326 to other portions of the electronic device housing 320. In this embodiment, the second protective side member 328 is secured to not only the second outer housing member 326 but also the support structure 304. In addition, in this embodiment, one or more securing features 329 can be provided on a bottom surface of the housing structure 304. The securing features 329 can be integral with the housing structure 304. As previously noted, the support structure 304 may be an outer periphery member for the electronic device housing 320. In this embodiment, the second protective side member 328 can be secured to the outer periphery member 304 on the opposite side from the first protective side member 302. The second protective side member 328 can be secured tightly adjacent the sides of the second outer housing member 326 using an adhesive 330. In one embodiment, the adhesive 330 can be applied as a layer of adhesive that is provided around a periphery of an inner side of the second outer housing member 326. The second protective side member 328 can also be molded in place so as to be tightly adjacent the sides of the second outer housing member 326. Further, a second internal space 332 is provided internal to the electronic device housing 320 (between the internal structure 322 and the second outer housing member 326) whereby various electrical components can be attached, affixed or placed so as to provide electronic operations for the electronic device. The second internal space 330 can be separate from or joined with the first internal space 324.

In one embodiment, the first outer housing member 301 can represent a top outer surface for the portable electronic device, and the second outer surface housing 326 can represent a bottom outer surface housing. In one embodiment, both the first outer housing member 301 and the second outer housing member 326 are glass (e.g., glass covers).

Figure 4A:
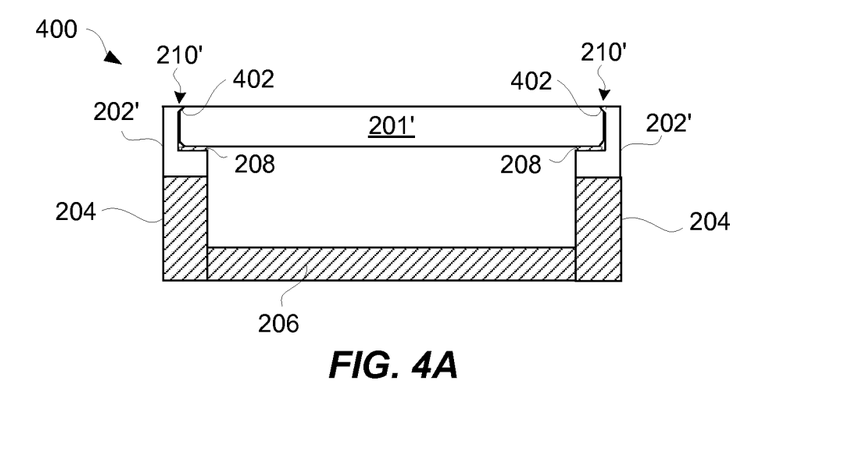
FIG. 4A is a cross-sectional view of an electronic device housing according to one embodiment.
Figure 4B:
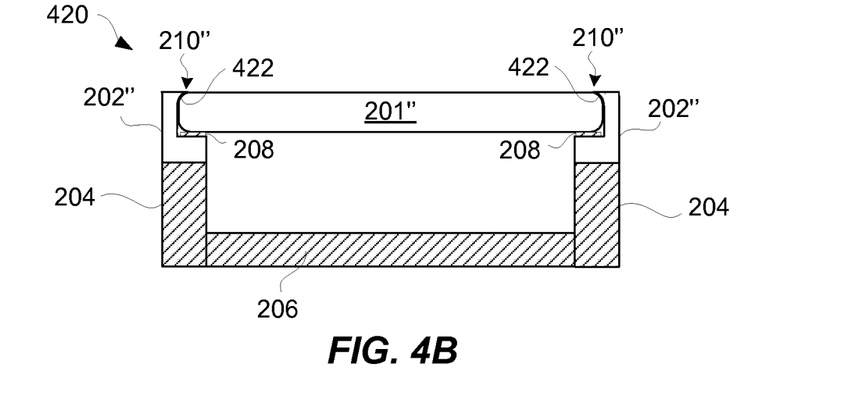
FIG. 4B is a cross-sectional view of an electronic device housing according to one embodiment.

Although the edges of the outer housing members (201, 226, 301, 326) can be square as suggested by FIGS. 2A-3C, it should understood that the edges of the outer housing member need not be square but can be formed with other geometries, such as with chamfered (or flattened) edges or rounded edges. FIGS. 4A and 4B are cross-sectional views of electronic device housings according to other embodiments that are similar to the electronic device housing 200 illustrated in FIG. 2A but which have different edge geometries for the outer device housing.

FIG. 4A is a cross-sectional view of an electronic device housing 400 according to one embodiment. The electronic device housing 400 is the same as the electronic device housing 200 illustrated in FIG. 2A except that the edges 402 of the outer housing member 201' have been chamfered (or flattened). Additionally, the protective side member 202' is molded against the edges of the outer housing member 401', including the chamfered edges 402. Hence, as with other embodiments, by molding the protective side member 202' in place, the outer exposed interface 210' between the sides (e.g., edges 402) of the outer housing member 201' and the peripheral side member 202' is essentially gap-free even though the edges 402 of the protective side member 202' are chamfered.

FIG. 4B is a cross-sectional view of an electronic device housing 420 according to one embodiment. The electronic device housing 420 is the same as the electronic device housing 200 illustrated in FIG. 2A except that the edges 422 of the outer housing member 201" have been rounded. Additionally, the protective side member 202" is molded against the edges of the outer housing member 401", including the rounded edges 422. Hence, as with other embodiments, by molding the protective side member 202" in place, the outer exposed interface 210" between the sides (e.g., edges 422) of the outer housing member 201" and the peripheral side member 202" is essentially gap-free even though the edges 422 of the protective side member 202" are rounded.

Figure 5:
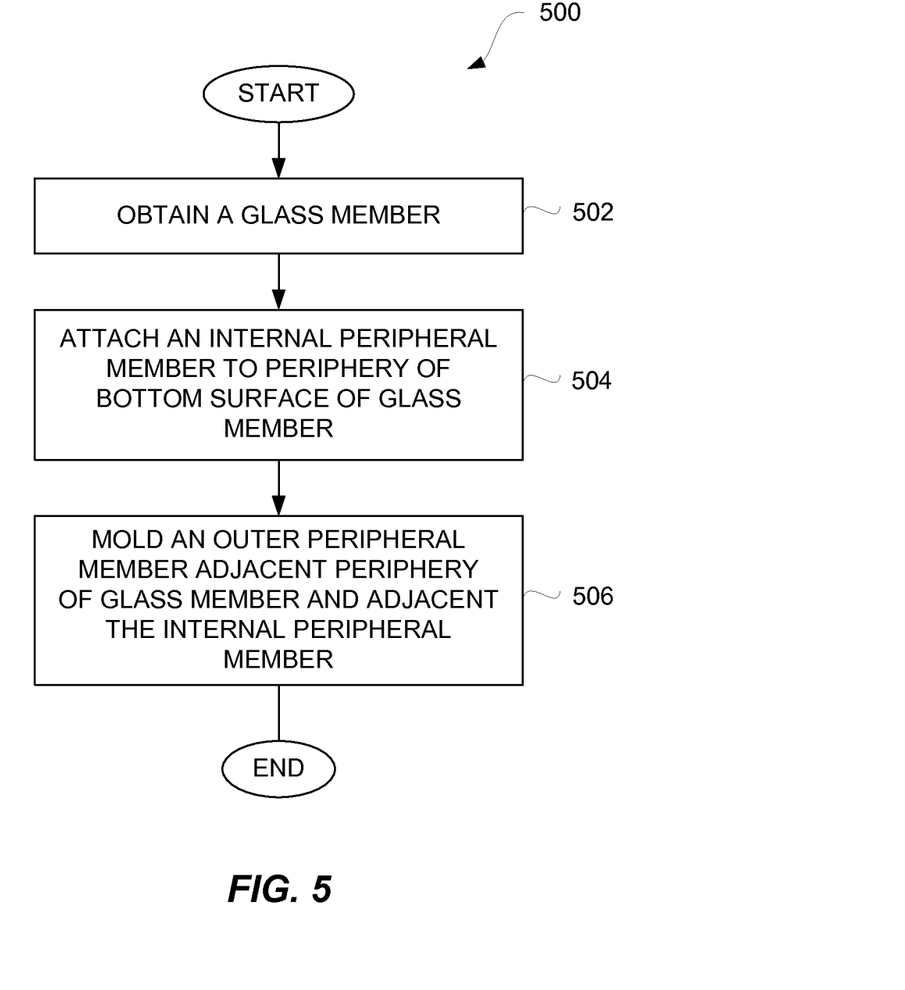
FIG. 5 is a flow diagram of a housing formation process according to one embodiment.

FIG. 5 is a flow diagram of a housing formation process 500 according to one embodiment. The housing formation process 500 can operate to produce a housing for an electronic device, or at least a portion of such a housing.

The housing formation process 500 can initially obtain 502 a glass member to be utilized with the housing for the electric device. The glass member to be utilized is a significant outer surface for the housing. For example, the glass member can correspond to a top surface for the housing. Alternatively, the glass member can correspond to a bottom surface for the housing. The glass member is typically thin, particularly when the housing being formed is for a portable electronic device. In one embodiment, the glass member has a thickness of less than 5 mm, and in another embodiment, the glass member has a thickness of less than 1 mm.

Next, an internal peripheral member can be attached 504 to the periphery of a bottom surface of the glass member. Typically, the internal peripheral member is attached 504 to the bottom surface of the glass member using an adhesive, though other means can be used, such as mechanical features (e.g., undercuts or interlocks).

Thereafter, an outer peripheral member can be formed 506, e.g., molded, adjacent the periphery of the glass member and adjacent the inner peripheral member. The outer peripheral member provides an exposed outer surface for the housing. Specifically, the outer peripheral member provides a thin protective later of material tightly adjacent the periphery of the glass member. The outer peripheral member can chemically bond with the inner peripheral member. Also, the inner peripheral member and/or the outer peripheral member can be secured to a support structure for the housing so that the glass member is able to be mechanically secured to the housing.

Figure 6:
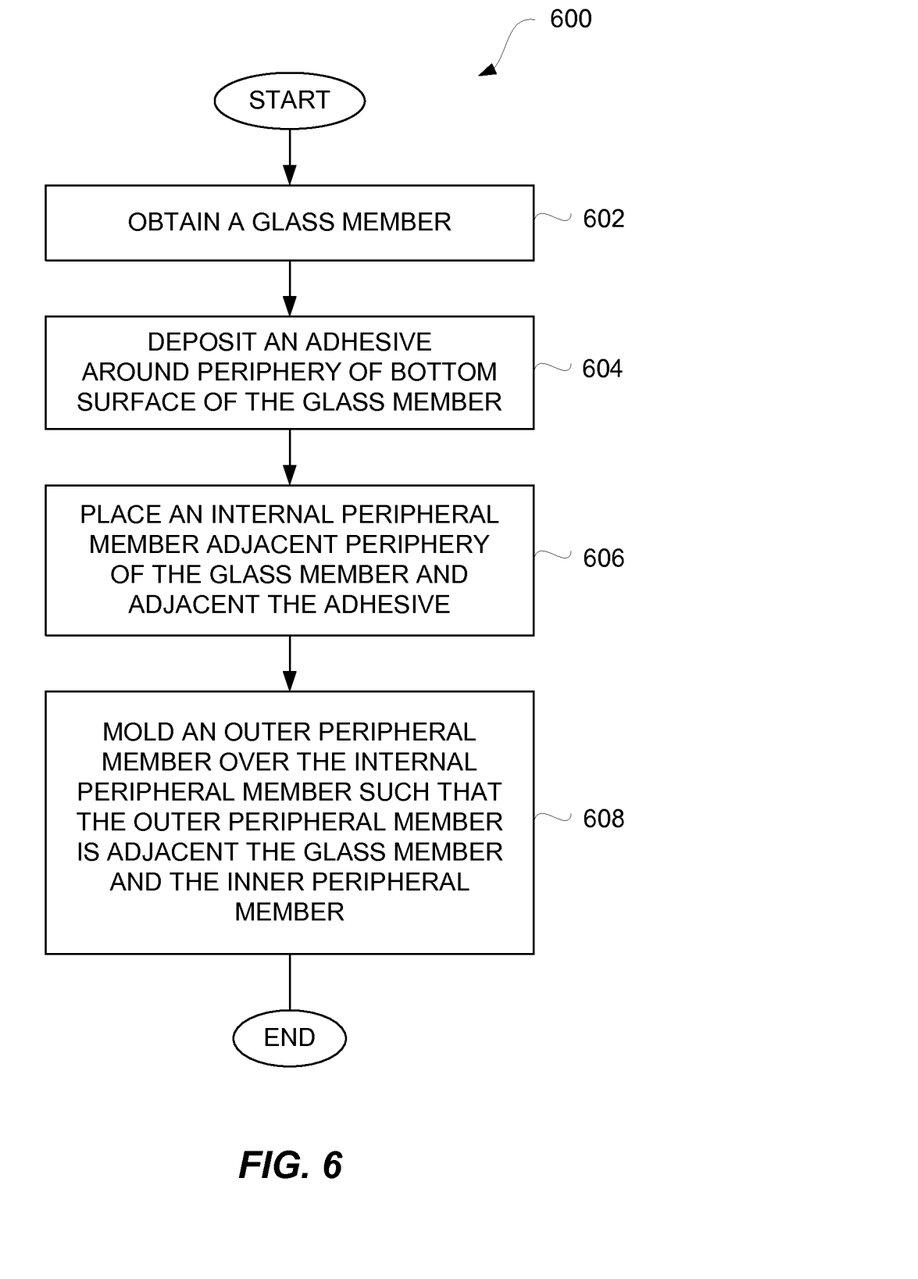
FIG. 6 a flow diagram of a housing formation process according to one embodiment.

FIG. 6 a flow diagram of a housing formation process 600 according to one embodiment. The housing formation process 600 can operate to produce a housing for an electronic device, or at least a portion of such a housing.

The housing formation process 600 can initially obtain 602 a glass member. The glass member is to serve as a significant outer surface for the housing. For example, the glass member can correspond to a top surface for the housing. Alternatively or additionally, the glass member can correspond to a bottom surface for the housing. The glass member is typically thin, particularly when used with portable electronic devices. In one embodiment, the glass member has a thickness of less than 5 mm, or more particularly less than 1 mm.

After the glass member has been obtained 602, an adhesive can be deposited 604 around a periphery of a bottom surface of the glass member. The glass member has a top surface that can represent an outer surface for the housing, and a bottom surface that is an inner surface that is not exposed. In one embodiment, the adhesive being deposited 604 can be a thermally activated adhesive. Also, the manner by which the adhesive is deposited can vary. In one implementation, the adhesive can be deposited 604 by forming a ring-like pattern of adhesive that can be placed around the periphery of the bottom surface of the glass member. In another implementation, the adhesive can be screen printed onto the periphery of the bottom surface of the glass member.

In addition, an internal peripheral member can be placed 606 to the periphery of the glass member and adjacent the adhesive. In one implementation, the internal peripheral member can be secured to the bottom surface of the glass member using an adhesive, though other means can be used, such as mechanical features (e.g., undercuts or interlocks). The internal peripheral member can also be placed 606 by molding the internal peripheral member in place. In one embodiment, if the adhesive is thermally activated, the molding can also serve to activate the thermally activated adhesive so that a strong bond can be provided to the glass member and the internal peripheral member.

Thereafter, an outer peripheral member can be molded 608 over the internal peripheral member such that the outer peripheral member is formed adjacent the periphery of the glass member and adjacent the inner peripheral member. The outer peripheral member provides an exposed outer surface for the housing. Specifically, the outer peripheral member provides a thin protective later of material tightly adjacent the periphery of the glass member. The outer peripheral member can chemically bond with the inner peripheral member. Alternatively or additionally, a thermally activated adhesive could be used between the internal peripheral member and the outer peripheral member (or between the glass member and the outer peripheral member), and the molding of the outer peripheral member in place can also serve to activate the thermally activated adhesive so that a strong bond can be provided the inner peripheral member (and/or the glass member). Also, the inner peripheral member and/or the outer peripheral member can be secured to a support structure for the housing so that the glass member is able to be mechanically secured to the housing. Typically, the peripheral members could be secured to the support structure by chemical bonding and/or mechanical features (e.g., undercuts or interlocks).

Figure 7A:
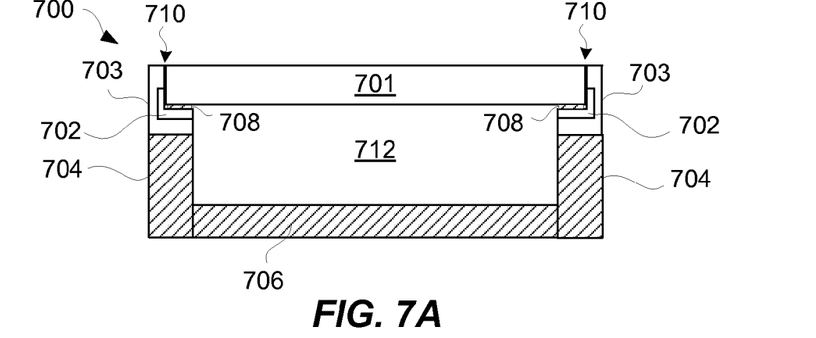
FIG. 7A is a cross-sectional view of an electronic device housing according to another embodiment.

FIG. 7A is a cross-sectional view of an electronic device housing 700 according to another embodiment. The electronic device housing 700 includes an outer housing member 701 supported and protected by an inner protective side member 702 and an outer protective side member 703. The inner protective side member 702 being positioned tightly adjacent sides of the outer housing member 701. The inner protective side member 702 can provide a thin layer of material positioned tightly adjacent sides of the outer housing member 701, thereby buffering impact at the sides of the outer housing member 701. The outer protective side member 703 being positioned tightly adjacent the sides of the inner protective side member 702 as well as the sides of the outer housing member 701. The outer and inner protective side members 702, 703 can individually or in combination provide a thin layer of material positioned tightly adjacent sides of the outer housing member 701, thereby buffering impact at the sides of the outer housing member 701.

One or both of the inner and outer protective side members 702, 703 can also support the outer housing member 701 and serve to secure the outer housing member 701 to other portions of the electronic device housing 700. In one embodiment, the outer protective side member 703 (and possibly also the inner protective side member 702) extends around all sides of the outer housing member 701. In another embodiment, the outer protective side member 703 (and possibly also the inner protective side member 702) extends around those of the sides of the outer housing member 701 that would otherwise be exposed.

As shown in FIG. 7A, the outer housing member 701 can be secured to a support structure 704 of the electronic device housing 700. The support structure 704 can, for example, be an outer periphery member for the electronic device housing 700. In one embodiment, the support structure 704 can couple to another outer housing member 706, which can be formed differently than the outer housing member 701.

The inner protective side member 702 can be secured tightly adjacent the sides of the outer housing member 701 using an adhesive 708. In one embodiment, the adhesive 708 can be applied as a layer of adhesive that is provided around a periphery of an inner side of the outer housing member 701. The adhesive 708 can thus serve to secure the inner protective side member 702 against the sides of the outer housing member 701. The outer protective side member 703 can be molded in place around at least a portion of the inner protective side member 702 and adjacent at least a portion of the sides of the outer housing member 701 so as to be tightly adjacent the sides of the outer housing member 701. By molding the outer protective side member 703 in place, the outer exposed interface 710 between the sides (e.g., edges) of the outer housing member 701 and the outer peripheral side member 703 is essentially gap-free. During the molding, the outer protective side member 703 can be chemically bonded to at least a portion of the inner protective side member 702. Also, if the adhesive 708 is thermally activated, the molding of the outer protective side member 703 can also serve to activate the thermally activated adhesive 708 so that a strong bond can be provided to the outer housing member 701 and the inner peripheral protective side member 702 via the adhesive 708. An internal space 712 is provided internal to the electronic device housing 700 whereby various electrical components can be attached, affixed or placed so as to provide electronic operations for the electronic device.

The various members, parts or assemblies of the electronic device housing 700 can be formed of any of a variety of materials, e.g., glass, polymers or metal. In one embodiment, the outer housing member 701 is glass, the protective side members 702, 703 can be formed from a polymer (e.g., thermoplastic), the support structure 704 can be formed from metal or polymer (e.g., plastic), and the another outer housing member 706 can be formed from glass, polymer (e.g., plastic) or metal. More particularly, in some embodiments, the protective side member 702 can be a structurally strengthened polymer (e.g., thermoplastic). As an example, the protective side member 702 can be polymer, such as polyarylamide, nylon or polycarbonate, which can be structurally strengthened by including glass fibers. For example, some examples of some structurally strengthened polymers include 50% glass filled nylon and 30% glass filled polycarbonate.

Figure 7B:
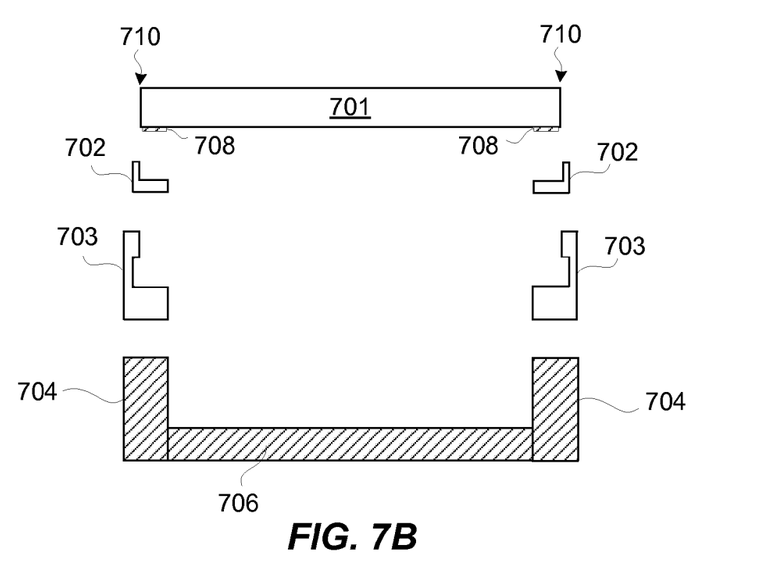
FIG. 7B is a cross-sectional assembly diagram for the electronic device housing shown in FIG. 7A, according to one embodiment.

FIG. 7B is a cross-sectional assembly diagram for the electronic device housing 700 shown in FIG. 7A, according to one embodiment. The outer housing member 701 has a top surface 714 and a bottom surface 716. The bottom surface 716 of the outer housing member 701 has adhesive 708 applied as a layer of adhesive that is provided around a periphery of the bottom surface 716 of the outer housing member 701. The inner protective side member 702 can then be secured adjacent the sides of the outer housing member 701. More particularly, the inner protective side member 702 can be secured to the inner protective side member 702 using the adhesive 708 on the bottom surface 716 of the outer housing member 701. The outer protective side member 703 can be molded adjacent at least a portion of the sides of the outer housing member 701 and adjacent or over one or more sides of the inner protective side member 702. The molding process can also lead to chemical bonding of the outer protective side member 703 and the inner protective side member 702.

Moreover, when the outer protective side member 703 is formed, the outer protective side member 703 can also be adjacent and secured to an upper side portion 718 of the support structure 704. When the outer protective side member 703 is provided at the sides (i.e., edges) of the outer housing member 701, the outer protective side member 703 (alone or in combination with the inner protective side member 702) provides a buffer layer (e.g., bumper) that dampens impact induced at the sides of the outer housing member 701 of the electronic device housing 700.

Figure 7C:
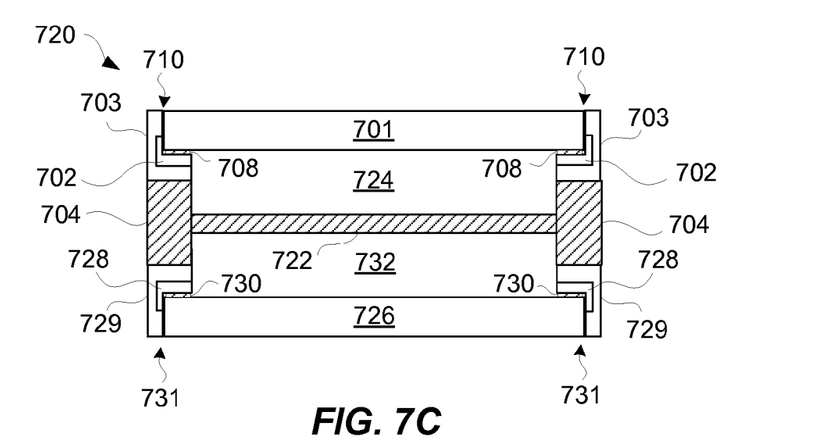
FIG. 7C is a cross-sectional view of an electronic device housing according to one embodiment.

FIG. 7C is a cross-sectional view of an electronic device housing 720 according to one embodiment. The electronic device housing 720 includes a first outer housing member 701 supported and protected by a first inner protective side member 702 and a first outer protective side member. The first inner protective side member 702 is positioned tightly adjacent sides of the first outer housing member 701. The outer protective side member 703 being positioned tightly adjacent the sides of the first inner protective side member 702 as well as the sides of the first outer housing member 701. The first outer and inner protective side members 702, 703 can individually or in combination provide a thin layer of material positioned tightly adjacent sides of the first outer housing member 701, thereby buffering impact at the sides of the first outer housing member 701.

One or both of the first inner and outer protective side members 702, 703 can also support the first outer housing member 701 and serve to secure the first outer housing member 701 to other portions of the electronic device housing 720. In one embodiment, the first outer protective side member 703 (and possibly also the first inner protective side member 702) extends around all sides of the first outer housing member 701. In another embodiment, the first outer protective side member 703 (and possibly also the first inner protective side member 702) extends around those of the sides of the first outer housing member 701 that would otherwise be exposed.

The first inner protective side member 702 can be secured tightly adjacent the sides of the first outer housing member 701 using an adhesive 708. In one embodiment, the adhesive 708 can be applied as a layer of adhesive that is provided around a periphery of an inner side of the first outer housing member 701. The adhesive 708 can thus serve to secure the first inner protective side member 702 against the sides of the first outer housing member 701. The first outer protective side member 703 can be molded in place around at least a portion of the first inner protective side member 702 and adjacent at least a portion of the sides of the first outer housing member 701 so as to be tightly adjacent the sides of the outer housing member 701. By molding the first outer protective side member 703 in place, the outer exposed interface 710 between the sides (e.g., edges) of the first outer housing member 701 and the first outer peripheral side member 703 is essentially gap-free. During the molding, the first outer protective side member 703 can be chemically bonded to at least a portion of the first inner protective side member 702. Also, if the adhesive 708 is thermally activated, the molding of the first outer protective side member 703 can also serve to activate the thermally activated adhesive 708 so that a strong bond can be provided to the first outer housing member 701 and the first inner peripheral protective side member 702 via the adhesive 708.

The electronic device housing 720 can also include an internal structure 722 that is integral with or secured to the support structure 704. In one embodiment, the internal structure 722 can be secured to an inner surface of the support structure 704 such that it is offset from front and back planar boundaries of the support structure 704 (which may be an outer periphery member). As shown in FIG. 7C, the internal structure 722 can be secured at the mid-point of the height of the support structure 704. A first internal space 724 is provided internal to the electronic device housing 720 whereby various electrical components can be attached, affixed or placed so as to provide electronic operations for the electronic device.

In this embodiment, the electronic device housing 720 can also include similar structures on an opposite side of the electronic device housing 720. Namely, the electronic device housing 720 can further include a second outer housing member 726 supported and protected by a second inner protective side member 728 and a second outer protective side member 729. The second inner protective side member 728 can be positioned tightly adjacent sides of the second outer housing member 726. The second outer protective side member 729 can be positioned tightly adjacent the sides of the inner protective side member 702 as well as the sides of the second outer housing member 726. The second outer and inner protective side members 728, 729 can individually or in combination provide a thin layer of material positioned tightly adjacent sides of the second outer housing member 726, thereby buffering impact at the sides of the second outer housing member 726.

One or both of the second inner and outer protective side members 728, 729 can also support the second outer housing member 726 and serve to secure the second outer housing member 726 to other portions of the electronic device housing 720. In one embodiment, the second outer protective side member 729 (and possibly also the inner protective side member 728) extends around all sides of the second outer housing member 726. In another embodiment, the second outer protective side member 729 (and possibly also the second inner protective side member 728) extends around those of the sides of the second outer housing member 726 that would otherwise be exposed.

The second inner protective side member 728 can be secured tightly adjacent the sides of the second outer housing member 726 using an adhesive 730. In one embodiment, the adhesive 730 can be applied as a layer of adhesive that is provided around a periphery of an inner side of the second outer housing member 726. The adhesive 730 can thus serve to secure the second inner protective side member 728 against the sides of the second outer housing member 726. The second outer protective side member 729 can be molded in place around at least a portion of the second inner protective side member 728 and adjacent at least a portion of the sides of the second outer housing member 726 so as to be tightly adjacent the sides of the second outer housing member 726. By molding the second outer protective side member 729 in place, the outer exposed interface 731 between the sides (e.g., edges) of the second outer housing member 726 and the second outer peripheral side member 729 is essentially gap-free. During the molding, the second outer protective side member 729 can be chemically bonded to at least a portion of the second inner protective side member 728. Also, if the adhesive 730 is thermally activated, the molding of the second outer protective side member 729 can also serve to activate the thermally activated adhesive 730 so that a strong bond can be provided to the second outer housing member 726 and the second inner peripheral protective side member 728 via the adhesive 730. An internal space 712 is provided internal to the electronic device housing 700 whereby various electrical components can be attached, affixed or placed so as to provide electronic operations for the electronic device.

Further, a second internal space 732 is provided internal to the electronic device housing 720 (between the internal structure 722 and the second outer housing member 726) whereby various electrical components can be attached, affixed or placed so as to provide electronic operations for the electronic device. The second internal space 732 can be separate from or joined with the first internal space 724.

The various members, parts or assemblies of the electronic device housing 720 can be formed of any of a variety of materials, e.g., glass, polymers or metal. In one embodiment, the outer housing members 701, 726 are glass, the protective side members 702, 703, 728, 729 can be formed from a polymer (e.g., thermoplastic), and the support structures 704, 722 can be formed from metal or polymer (e.g., plastic). More particularly, in some embodiments, the protective side members 702, 703, 728, 729 can be a structurally strengthened polymer (e.g., thermoplastic). As an example, the protective side members 702, 703, 728, 729 can be polymer, such as polyarylamide, nylon or polycarbonate, which can be structurally strengthened by including glass fibers. For example, some examples of some structurally strengthened polymers include 50% glass filled nylon and 30% glass filled polycarbonate.

In one embodiment, the first outer housing member 701 can represent a top outer surface for the portable electronic device, and the second outer surface housing 726 can represent a bottom outer surface housing. In one embodiment, both the first outer housing member 701 and the second outer housing member 726 are glass (e.g., glass covers).

The protective side members discussed above are typically thin layers of material positioned tightly adjacent sides of the outer housing member, thereby buffering impact at the sides of the outer housing members. In one embodiment, the protective side members are to be strong; hence, a structurally strengthened polymer, such as polyarylamide, can be utilized. The polyarylamide can be strengthened by containing glass fibers. One source of strengthened polyarylamide is IXEF polyarylamide (PARA) from Solvay Advanced Polymers, L.L.C which can contain glass fiber reinforcement.

Additionally, since the protective side members are tightly adjacent sides of the outer housing member, the respective materials used for the protective side members and the outer housing member. Specifically, the Coefficient of Thermal Expansion (CTE) of the respective materials, if not controlled, can produce undesired stress on the sides of the outer housing member. For example, with an outer housing member of glass, its CTE is about 10 millimeters/meter/° C. Hence, ideally, for this example the CTE of the material for the protective side members would be about 10 millimeters/meter/° C. Although plastics tend to have CTE's (e.g., roughly 100 millimeters/meter/° C.) that are dramatically higher than that of glass, some manufactured polymers, such as polyarylamide, can have CTE's (e.g., roughly 30 millimeters/meter/° C.) that are substantially closer to that of glass and thereby would, if used, induce less stress on the sides of the outer housing member. For example, in one embodiment, a manufactured polymer for such use could have a CTE less than or equal to about 50 millimeters/meter/° C., and in another embodiment, a manufactured polymer for such use could have a CTE less than or equal to about 35 millimeters/meter/° C. In one implementation, additive can be added to a polymer so to bring is CTE closer to that of glass. As examples, the additives can be particles or fibers which can be formed from glass or ceramic. Also, as noted above, the thickness of the protective side member can be thin, for example, the thickness can be on the order of about 1 mm or less in one embodiment.

In still other embodiments, the protective side materials can be formed from multiple materials that can be alternated, intertwined or layered. The later of material against the edges of the outer housing member of glass can have a CTE relatively close to that of glass while an outer layer can have a higher CTE can permit a greater range of material, such as polymers (e.g., plastics).

The protective side members are able to be thin yet be cosmetically unintrusive. For example, in some embodiments, the thickness (t1) for the protective side member can be less than 1 mm (e.g., 0.8 mm). Also, in some embodiments, the thickness (t2) of the outer housing member can be less than 5 mm (e.g., 1 mm). However, these thicknesses are exemplary and vary with the size of the electronic device housing and with desired strength. Using a strengthened material for the protective side members as noted above can also be advantageous. Nevertheless, the provisioning of thin protective side members for outer housing members, such as glass covers, facilitates providing portable electronic device housings that are compact and thin yet resistant to side impact damage to the outer housing members.

According to another aspect, a glass member for which a component (e.g., peripheral side member) is being form around can be protected during a molding process. A metal mold is normally used in molding. However, the metal mold can damage (e.g., scratch) a glass member during molding. To mitigate the chance of damage to a glass member, the metal mold (i.e., its inner surfaces) can be coated. The coating can, for example, be a thin layer of polytetrafluoroethylene (PTFE) or polyimide film.

Additional details on side protective members for electronic device housings are contained in U.S. application Ser. No. 12/794,563, filed Jun. 4, 2010, and entitled "OFFSET CONTROL FOR ASSEMBLYING AN ELECTRONIC DEVICE HOUSING," which is hereby incorporated herein by reference.

In general, the steps associated with the methods of the present invention may vary widely. Steps may be added, removed, altered, combined, and reordered without departing from the spirit or the scope of the present invention.

The various aspects, features, embodiments or implementations of the invention described above may be used alone or in various combinations.

While this specification contains many specifics, these should not be construed as limitations on the scope of the disclosure or of what may be claimed, but rather as descriptions of features specific to particular embodiment of the disclosure. Certain features that are described in the context of separate embodiments may also be implemented in combination. Conversely, various features that are described in the context of a single embodiment may also be implemented in multiple embodiments separately or in any suitable subcombination. Moreover, although features may be described above as acting in certain combinations, one or more features from a claimed combination can in some cases be excised from the combination, and the claimed combination may be directed to a subcombination or variation of a subcombination.

While embodiments and applications have been shown and described, it would be apparent to those skilled in the art having the benefit of this disclosure that many more modifications than mentioned above are possible without departing from the inventive concepts herein.

What is claimed is:

1. An electronic device enclosure, comprising:
a glass cover for a top surface for the electronic device enclosure;
an adhesive deposited around a bottom surface periphery of the glass cover;
a first peripheral structure for providing a support surface for the glass cover and for providing side protective surfaces for the glass cover, the first peripheral structure having an extended portion including a first surface parallel a second surface, the first surface configured to receive the adhesive such that the first peripheral structure is at least partially secured to the glass cover by the adhesive; and
an enclosure support structure having an upper surface coupled to the second surface of the first peripheral structure, the enclosure support structure further comprises a lower surface, the lower surface opposite the upper surface, the lower surface coupled to a second peripheral structure,
wherein the first peripheral structure is molded about the periphery of the glass cover, molded adjacent the adhesive, and molded adjacent to the enclosure support structure.

2. An electronic device enclosure as recited in claim 1, wherein the enclosure support structure comprises an outer periphery member for the electronic device enclosure.

3. An electronic device enclosure as recited in claim 1, wherein the adhesive is thermally activated, and
wherein the adhesive is thermally activated while the first peripheral structure is molded about the glass cover.

4. An electronic device enclosure as recited in claim 3, wherein the molding of the first peripheral structure about the glass cover provides a gap-free interface between edges of the glass cover and the first peripheral structure provided about the periphery of the glass cover.

5. An electronic device enclosure as recited in claim 1, wherein the molding of the first peripheral structure about the glass cover provides a gap-free interface between edges of the glass cover and the first peripheral structure provided about the periphery of the glass cover.

6. An electronic device enclosure as recited in claim 1,
wherein the adhesive is deposited on the bottom surface of the glass cover, and
wherein the first peripheral structure is molded about the periphery of the glass cover and molded adjacent the adhesive.

7. An electronic device enclosure as recited in claim 6, wherein the adhesive is thermally activated.

8. An electronic device enclosure as recited in claim 6, wherein the first peripheral structure comprises a polymer, and wherein the polymer includes additives such that the CTE of the first peripheral structure is made closer to the CTE of the glass cover.

9. An electronic device enclosure as recited in claim 8, wherein the additives comprise particles or fibers made of glass or ceramic.

10. An electronic device enclosure as recited in claim 1, wherein the adhesive is thermally activated, and
wherein the adhesive is applied as a film or a layer.

11. An electronic device enclosure as recited in claim 1, wherein the first peripheral structure comprises a polymer.

12. An electronic device enclosure as recited in claim 1, wherein the first peripheral structure comprises a polymer strengthened by containing glass fibers.

13. An electronic device enclosure as recited in claim 1,
wherein the first peripheral structure is molded about the periphery of the glass cover and molded adjacent the adhesive, and
wherein the adhesive includes a feature to which the first peripheral structure is formed.

14. An electronic device enclosure as recited in claim 1, wherein the enclosure support structure comprises a metal support structure.

15. An electronic device enclosure as recited in claim 14,
wherein the metal support structure has at least one feature that provides a mechanical interlock with the first peripheral structure after the first peripheral structure has been molded.

16. An electronic device enclosure as recited in claim 1, wherein the thickness of the glass cover window is about 0.3-1.0 mm.

17. An electronic device enclosure as recited in claim 1,
wherein the first peripheral structure includes an inner peripheral member and an outer peripheral member,
wherein the inner peripheral member is attached to the glass cover via the adhesive, and
wherein at least the outer peripheral member is molded about at least a portion of the periphery of the glass cover and about at least a portion of the inner peripheral member.

18. An electronic device enclosure as recited in claim 17, wherein the molding of the outer peripheral member about at least the portion of the periphery of the glass cover provides a gap-free interface between edges of the glass cover and the outer peripheral member provided about at least a portion of the periphery of the glass cover.

19. An electronic device enclosure, comprising:
a glass cover for a top surface for the electronic device enclosure;
an adhesive deposited at a periphery of the glass cover;
a first peripheral structure for providing a support surface for the glass cover and for providing side protective surfaces for the glass cover, the first peripheral structure having an extended portion including a first surface parallel to a second surface, the first surface configured to receive the adhesive such that the first peripheral structure is at least partially secured to the glass cover by the adhesive; and a support structure having a top side, the top side including at least one interlock feature for coupling to the first peripheral structure, wherein the support structure further comprises a bottom side, the bottom side opposite the top side, the bottom side coupled to a second peripheral structure, wherein the first peripheral structure is molded about the periphery of the glass cover, molded adjacent the adhesive, and molded adjacent to the support structure and against the at least one interlock feature.

20. An electronic device enclosure as recited in claim 19, wherein the first peripheral structure comprises a polymer strengthened by containing glass fibers.

21. An electronic device enclosure as recited in claim 19, wherein the adhesive is deposited on the bottom surface of the glass cover, and wherein the first peripheral structure is molded about the periphery of the glass cover and molded adjacent the adhesive.

22. An electronic device enclosure as recited in claim 21, wherein the adhesive is thermally activated.

23. An electronic device enclosure as recited in claim 19, further comprising a second glass cover coupled to the second peripheral structure.

24. An electronic device enclosure as recited in claim 19, wherein the first peripheral structure comprises a polymer, and wherein the polymer includes additives such that the CTE of the first peripheral structure is made closer to the CTE of the glass cover.

25. An electronic device enclosure as recited in claim 24, wherein the additives comprise particles or fibers made of glass or ceramic.

26. An electronic device enclosure as recited in claim 19, wherein the support structure comprises a metal support structure.

27. An electronic device enclosure as recited in claim 19, wherein the thickness of the glass cover window is about 0.3-1.0 mm.

28. An electronic device enclosure as recited in claim 19, wherein the support structure comprises an outer periphery member for the electronic device enclosure.

29. An electronic device enclosure, comprising:
a glass cover for a top surface for the electronic device enclosure;
an adhesive deposited around a periphery of the glass cover;
a first peripheral structure for providing a support surface for the glass cover and for providing side protective surfaces for the glass cover, the first peripheral structure having an extended portion including a first surface parallel to a second surface, the first surface configured to receive the adhesive such that the first peripheral structure is at least partially secured to the glass cover by the adhesive;
a support structure having an upper surface, the upper surface including at least one interlock feature for coupling to the first peripheral structure, wherein the support structure further comprises a bottom surface, the bottom surface opposite the upper surface, the bottom surface coupled to a second peripheral structure; and
at least one interlock feature on the upper surface of the support structure, the support structure coupled to the second surface of the first peripheral structure via the at least one interlock feature,
wherein the first peripheral structure is molded about the periphery of the glass cover, molded adjacent the adhesive, and molded adjacent to the support structure and against the at least one interlock feature.

30. An electronic device enclosure as recited in claim 29, wherein the first peripheral structure comprises a polymer strengthened by containing glass fibers.

31. An electronic device enclosure as recited in claim 29, wherein the adhesive is deposited on the bottom surface of the glass cover, and wherein the first peripheral structure is molded about the periphery of the glass cover and molded adjacent the adhesive.

32. An electronic device enclosure as recited in claim 31, wherein the adhesive is thermally activated.

33. An electronic device enclosure as recited in claim 32, wherein the thickness of the glass cover window is about 0.3-1.0 mm.

34. An electronic device enclosure as recited in claim 33, further comprising a second glass cover coupled to the second peripheral structure.

35. An electronic device enclosure as recited in claim 33, wherein the first peripheral structure comprises a polymer, and wherein the polymer includes additives such that the CTE of the first peripheral structure is made closer to the CTE of the glass cover.

36. An electronic device enclosure as recited in claim 35, wherein the additives comprise particles or fibers made of glass or ceramic.

37. An electronic device enclosure as recited in claim 32, wherein the support structure comprises an outer periphery member for the electronic device enclosure.

* * * * *